US010958246B2

(12) United States Patent
Miyamoto

(10) Patent No.: US 10,958,246 B2
(45) Date of Patent: Mar. 23, 2021

(54) ACOUSTIC WAVE FILTER

(71) Applicant: Murata Manufacturing Co., Ltd., Nagaokakyo (JP)

(72) Inventor: Koji Miyamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/876,191

(22) Filed: May 18, 2020

(65) Prior Publication Data

US 2020/0280302 A1    Sep. 3, 2020

Related U.S. Application Data

(63) Continuation of application No. PCT/JP2018/047302, filed on Dec. 21, 2018.

(30) Foreign Application Priority Data

Dec. 27, 2017 (JP) .............................. JP2017-251249

(51) Int. Cl.
*H03H 9/64* (2006.01)
*H03H 9/145* (2006.01)
*H03H 9/25* (2006.01)

(52) U.S. Cl.
CPC .............. *H03H 9/64* (2013.01); *H03H 9/145* (2013.01); *H03H 9/25* (2013.01); *H03H 9/6483* (2013.01)

(58) Field of Classification Search
CPC ....................................................... H03H 9/25
See application file for complete search history.

(56) References Cited

U.S. PATENT DOCUMENTS

| 6,559,738 B2* | 5/2003 | Tsuruoka | H03H 9/14505 310/313 B |
| 7,075,390 B1* | 7/2006 | Bungo | H03H 9/0259 310/313 A |
| 7,173,360 B2* | 2/2007 | Hartmann | H03H 9/02685 310/313 D |
| 7,973,449 B2* | 7/2011 | Wall | H03H 9/14505 310/313 B |
| 2019/0379353 A1 | 12/2019 | Nakahashi | |

FOREIGN PATENT DOCUMENTS

| JP | 11-145760 A | 5/1999 |
| JP | 2002-152004 A | 5/2002 |
| JP | 2002-314363 A | 10/2002 |
| JP | 2016-192696 A | 11/2016 |
| WO | 2016/039026 A1 | 3/2016 |
| WO | 2018/168503 A1 | 9/2018 |

OTHER PUBLICATIONS

Official Communication issued in International Patent Application No. PCT/JP2018/047302, dated Mar. 5, 2019.

* cited by examiner

*Primary Examiner* — Dean O Takaoka
*Assistant Examiner* — Alan Wong
(74) *Attorney, Agent, or Firm* — Keating & Bennett, LLP

(57) ABSTRACT

An acoustic wave filter includes series arm resonators and parallel arm resonators, which are acoustic wave resonators including IDT electrodes provided on a piezoelectric substrate. The IDT electrodes of the series arm resonators include a first thinned electrode (floating electrode) and the IDT electrodes of the parallel arm resonators include a second thinned electrode (filled electrode).

18 Claims, 10 Drawing Sheets

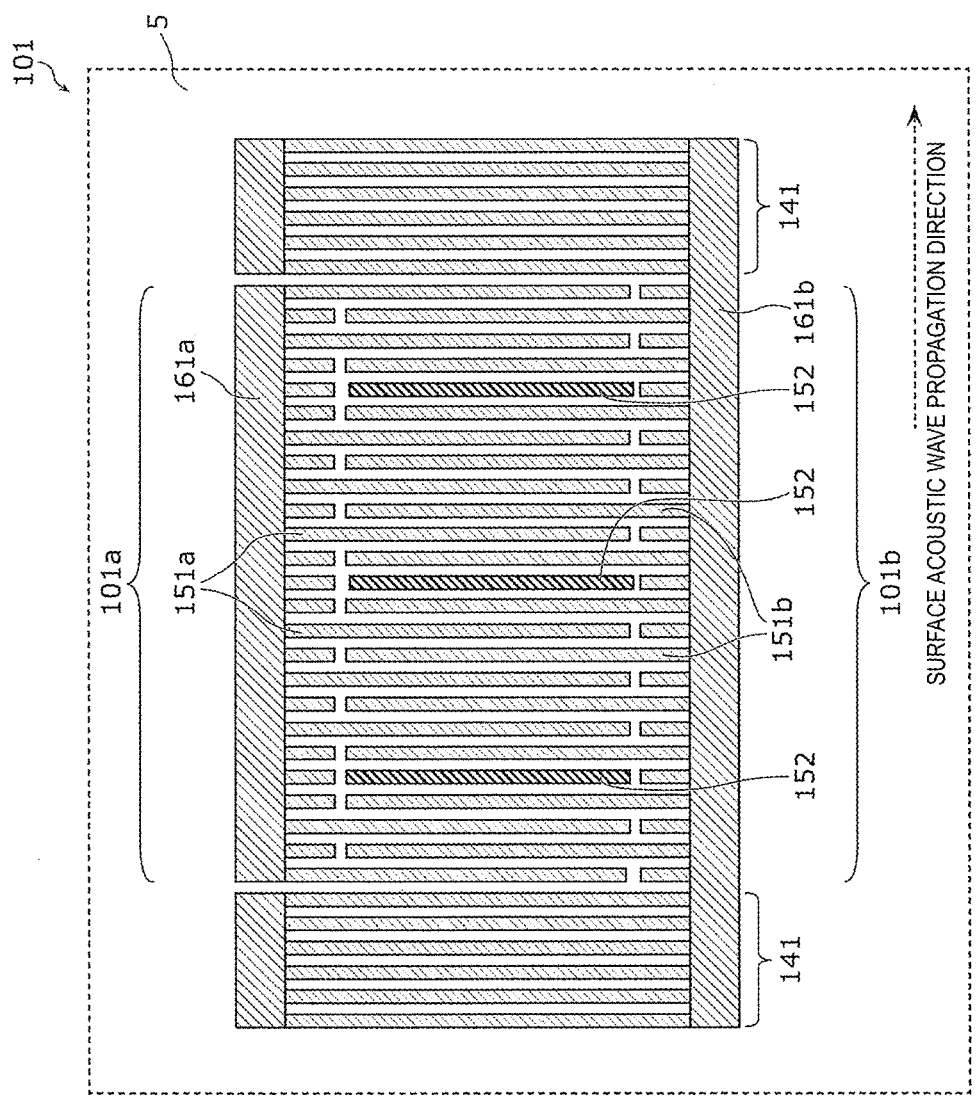

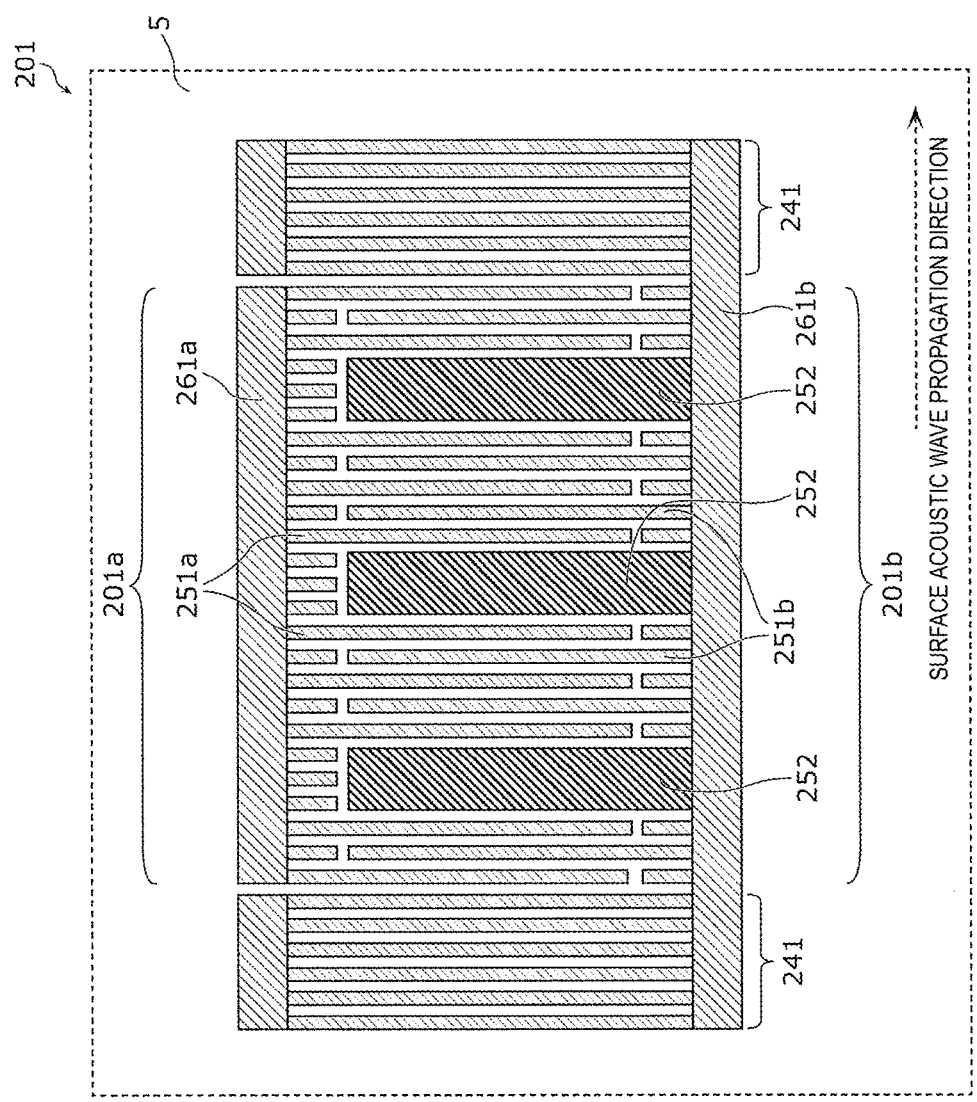

FREQUENCY (MHz)

ACOUSTIC WAVE FILTER

CROSS REFERENCE TO RELATED APPLICATIONS

This application claims the benefit of priority to Japanese Patent Application No. 2017-251249 filed on Dec. 27, 2017 and is a Continuation Application of PCT Application No. PCT/JP2018/047302 filed on Dec. 21, 2018. The entire contents of each application are hereby incorporated herein by reference.

BACKGROUND OF THE INVENTION

1. Field of the Invention

The present invention relates to an acoustic wave filter including thinned electrodes.

2. Description of the Related Art

As a band pass filter used in a radio frequency (RF) circuit of a communication device or the like, a surface acoustic wave filter is in practical use. In view of efficient utilization of the frequency resource for wireless communications, many frequency bands are allocated as communication bands for mobile phones or the like, and as a result, intervals between adjacent frequency bands are relatively narrow. In consideration of this circumstance regarding frequency band allocation, the degree of insertion loss transition from a pass band to an attenuation band on a low-frequency side of the pass band (hereinafter referred to as the sharpness at a low-frequency end) and the degree of insertion loss transition from a pass band to an attenuation band on a high-frequency side of the pass band (hereinafter referred to as the sharpness at a high-frequency end) are important design parameters for surface acoustic wave filters.

Japanese Unexamined Patent Application Publication No. 2002-152004 discloses a surface acoustic wave device including series-arm surface-acoustic-wave resonators and parallel-arm surface-acoustic-wave resonators, in which at least one of the series-arm surface-acoustic-wave resonators and the parallel-arm surface-acoustic-wave resonators is subjected to weighting by a thinning technique for the purpose of improving the steepness at a low-frequency end of pass band and the sharpness at a high-frequency end.

The sharpness at low- and high-frequency ends of an acoustic wave filter significantly depends on the Q characteristic of series arm resonators and parallel arm resonators of the acoustic wave filter.

However, concerning the surface acoustic wave device disclosed in Japanese Unexamined Patent Application Publication No. 2002-152004, in which a thinned electrode is applied to an acoustic wave resonator, no consideration is given to the relationship between the shape of the thinned electrode and the Q characteristic of the acoustic wave resonator in which the thinned electrode is used. This means that, since the thinned electrode disclosed in Japanese Unexamined Patent Application Publication No. 2002-152004 is not made in consideration of the Q characteristic affected by the shape of the thinned electrode, the sharpness at high- and low-frequency ends of the pass band cannot be effectively improved in accordance with required specifications.

SUMMARY OF THE INVENTION

Preferred embodiments of the present invention provide acoustic wave filters including series arm resonators and parallel arm resonators in each of which, sharpness at high- and low-frequency ends of a pass band is effectively improved.

An acoustic wave filter according to a preferred embodiment of the present invention includes a first input-output terminal and a second input-output terminal, one or more series arm resonators on a path connecting the first input-output terminal and the second input-output terminal, and one or more parallel arm resonators between the path and ground. The one or more series arm resonators and the one or more parallel arm resonators are each an acoustic wave resonator including an interdigital transducer (IDT) electrode provided on a substrate with piezoelectricity. The IDT electrode includes a pair of comb-shaped electrodes each including a plurality of electrode fingers that extend in a direction crossing a propagation direction of acoustic waves and that are in parallel or substantially in parallel with each other and a busbar electrode that connects one-side ends of electrode fingers of the plurality of electrode fingers to each other. When a particular electrode finger of the plurality of electrode fingers that is coupled to neither busbar electrode of the pair of comb-shaped electrodes is determined as a first thinned electrode, and when a particular electrode finger of the plurality of electrode fingers that has a widest electrode finger width twice or more an average electrode finger width of the electrode fingers excluding the particular electrode finger is determined as a second thinned electrode, the IDT electrode of at least one of the one or more series arm resonators includes the first thinned electrode and the IDT electrode of at least one of the one or more parallel arm resonators includes the second thinned electrode.

To improve the sharpness at low- and high-frequency ends of the pass band of the acoustic wave filter including series arm resonators and parallel arm resonators, subjecting the IDT electrode to weighting by using a thinning technique is effective. Particularly in a ladder acoustic wave filter, the sharpness at the low-frequency end of pass band is improved when the Q characteristic in the range close to the resonant frequency of the parallel arm resonator is improved, while the sharpness at the high-frequency end of pass band is improved when the Q characteristic in the range close to the anti-resonant frequency of series arm resonator is improved.

The inventor of preferred embodiments of the present invention discovered that, when the acoustic wave resonator including the first thinned electrode and the acoustic wave resonator including the second thinned electrode are compared to each other with respect to the Q factor, the acoustic wave resonator including the second thinned electrode provides higher Q factors on the low-frequency side close to the resonant frequency, while the acoustic wave resonator including the first thinned electrode provides higher Q factors on the high-frequency side close to the anti-resonant frequency.

In view of this, in the configuration described above, the IDT electrode including the second thinned electrode is provided in the parallel arm resonators and the IDT electrode including the first thinned electrode is provided in the series arm resonators. With this configuration, the sharpness can be effectively improved at both low- and high-frequency ends of the pass band.

Furthermore, the IDT electrode included in each of the one or more series arm resonators may include the first thinned electrode.

In the configuration described above, the IDT electrode including the first thinned electrode is provided in all the series arm resonators of the acoustic wave filter. This configuration improves to the greatest extent the sharpness at the high-frequency end of pass band.

Moreover, the IDT electrode of each of the one or more parallel arm resonators may include the second thinned electrode.

In the configuration described above, the IDT electrode including the second thinned electrode is provided in all the parallel arm resonators of the acoustic wave filter. This configuration improves to the greatest extent the sharpness at the low-frequency end of pass band.

Further, concerning the IDT electrode of each of the one or more series arm resonators, when a proportion of a count of the first thinned electrode to a total count of the plurality of electrode fingers is determined as a first thinning rate of the IDT electrode, the first thinning rate of the IDT electrode including the first thinned electrode may be about 30% or less.

The Q factor improves when the IDT electrode includes the first thinned electrode, but the Q factor of the IDT electrode deteriorates when the first thinning rate is set at over about 30%. By contrast, with the configuration described above, relatively high Q factors are able to be achieved in the range close to the anti-resonant frequency of the series arm resonators including the first thinned electrode. As a result, in comparison to the acoustic wave filter that supports the same band width and in which the series arm resonators do not include the first thinned electrode, the sharpness at the high-frequency end of pass band is able to be improved.

Furthermore, concerning the IDT electrode of each of the one or more parallel arm resonators, when a proportion of a count of the second thinned electrode to a total count of the plurality of electrode fingers is determined as a second thinning rate of the IDT electrode, the second thinning rate of the IDT electrode including the second thinned electrode may be about 30% or less.

The Q factor improves when the IDT electrode includes the second thinned electrode, but the Q factor of the IDT electrode deteriorates when the second thinning rate is set at over about 30%. By contrast, with the configuration described above, relatively high Q factors are able to be achieved in the range close to the resonant frequency of the parallel arm resonators including the second thinned electrode. As a result, in comparison to the acoustic wave filter that supports the same band width and in which the parallel arm resonators do not include the second thinned electrode, the sharpness at the low-frequency end of pass band is able to be improved.

Moreover, the substrate may include a piezoelectric film including one surface on which the IDT electrode is provided, a high-acoustic-velocity support substrate in which a bulk wave propagates at an acoustic velocity higher than an acoustic velocity of an acoustic wave propagating along the piezoelectric film, and a low-acoustic-velocity film that is positioned between the high-acoustic-velocity support substrate and the piezoelectric film and in which a bulk wave propagates at an acoustic velocity lower than an acoustic velocity of a bulk wave propagating in the piezoelectric film.

With this configuration, in addition to improvement in the Q factor of the acoustic wave resonator by using the thinned electrode, the Q factor of the acoustic wave resonator is able to be maintained at relatively high values. As a result, it is possible to provide an acoustic wave filter having the low loss characteristic in the pass band.

The acoustic wave filters according to preferred embodiments of the present invention each enable effective improvement of the sharpness at high- and low-frequency ends of pass band.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a schematic plan view showing an example of a structure of an interdigital transducer (IDT) electrode of series arm resonators of an acoustic wave filter according to a preferred embodiment of the present invention.

FIG. 4B is a schematic plan view showing an example of a structure of the IDT electrode of parallel arm resonators of an acoustic wave filter according to a preferred embodiment of the present invention.

DETAILED DESCRIPTION OF THE PREFERRED EMBODIMENTS

Figure 1:
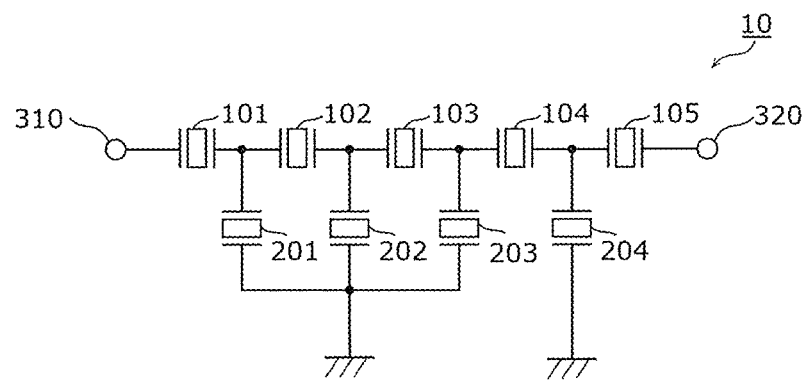
FIG. 1 is a circuit diagram of an acoustic wave filter according to a preferred embodiment of the present invention.

Hereinafter, preferred embodiments of the present invention will be described in detail with reference to the drawings. It should be noted that the preferred embodiments described below are all specific or comprehensive examples. The numerical values, the shapes, the materials, the elements, the arrangements of the elements, the connection configurations, and the like provided in the following preferred embodiments are mere examples and are not intended to limit the present invention. Among the elements in the following preferred embodiments, elements not recited in any of the independent claims are described as arbitrary or optional elements. Furthermore, the size or the size ratio of the elements illustrated in the drawings is not necessarily presented in an exact manner.

Preferred Embodiment

1. Circuit Configuration of Acoustic Wave Filter

FIG. 1 is a circuit configuration diagram of an acoustic wave filter 10 according to a preferred embodiment of the present invention. As illustrated in FIG. 1, the acoustic wave filter 10 includes series arm resonators 101, 102, 103, 104, and 105, parallel arm resonators 201, 202, 203, and 204, and input-output terminals 310 and 320.

The series arm resonators 101 to 105 are disposed on a path connecting the input-output terminal 310 (a first input-output terminal) and an input-output terminal 320 (a second input-output terminal) and coupled in series with each other. The parallel arm resonators 201 to 204 are each disposed between a node on the path and a ground terminal. The ground terminals to which the parallel arm resonators 201, 202, and 203 are coupled are configured in a common manner. Since the series arm resonators 101 to 105 and the parallel arm resonators 201 to 204 are coupled to each other as described above, the acoustic wave filter 10 defines a ladder band pass filter.

Commonization and individualization of the ground terminals to which the parallel arm resonators 201, 202, 203, and 204 are coupled are not limited to the coupling configuration illustrated in the FIG. 1, and may be selected in any suitable manner in view of controlling the attenuation pole of the acoustic wave filter 10.

Additionally, the number of series arm resonators included in the acoustic wave filter 10 is not limited to five as illustrated in FIG. 1, and may be any number equal to or greater than one. Similarly, the number of parallel arm resonators included in the acoustic wave filter 10 is not limited to four as illustrated in FIG. 1, and may be any number equal to or greater than one.

Furthermore, for example, circuit elements such as an inductor and a capacitor, and a longitudinally coupled resonator may be included among the series arm resonators 101 to 105, the parallel arm resonators 201 to 204, and the input-output terminals 310 and 320.

Hereinafter, a basic structure of the series arm resonators and the parallel arm resonators of the acoustic wave filter 10 is described.

2. Structure of Acoustic Wave Resonator

Figure 2A:
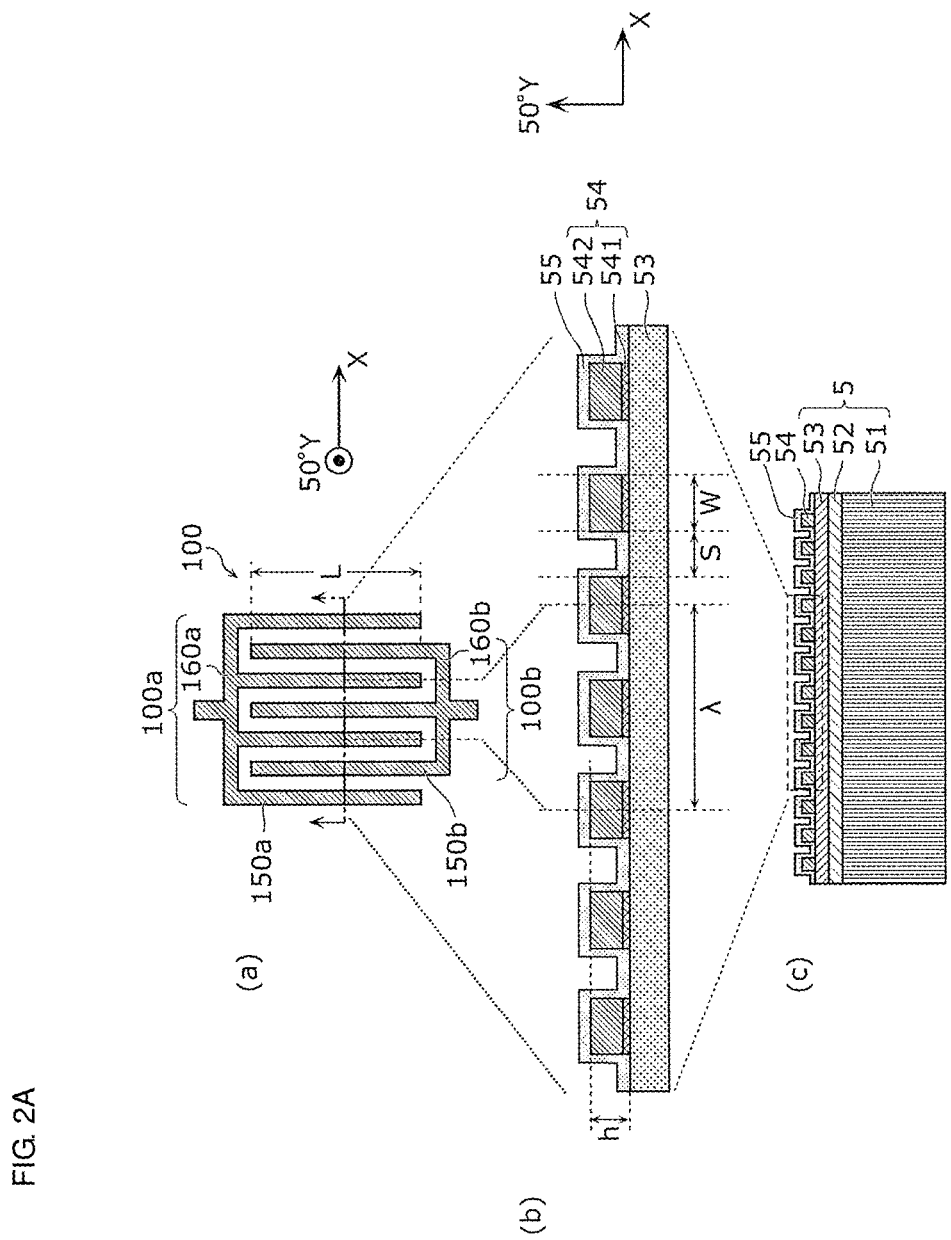
FIG. 2A includes a plan view and sectional views schematically showing an example of an acoustic wave resonator according to a preferred embodiment of the present invention.

FIG. 2A is a schematic diagram schematically illustrating an example of an acoustic wave resonator according to the present preferred embodiment, in which part (a) is a plan view and parts (b) and (c) are sectional views taken along a dot-dash line illustrated in part (a). FIG. 2A illustrates as one example an acoustic wave resonator 100 having a basic structure of the series arm resonators 101 to 105 and the parallel arm resonators 201 to 204 of the acoustic wave filter 10. The acoustic wave resonator 100 illustrated in FIG. 2A is used only to explain a typical structure of an acoustic wave resonator, and thus, the number of electrode fingers of an electrode, the length of electrode fingers, and the like are not limited to this example.

The acoustic wave resonator 100 includes a substrate 5 with piezoelectricity and comb-shaped electrodes 100a and 100b.

As illustrated in part (a) of FIG. 2A, the comb-shaped electrodes 100a and 100b facing each other in a pair are provided on the substrate 5. The comb-shaped electrode 100a includes a plurality of electrode fingers 150a parallel or substantially parallel to each other and a busbar electrode 160a connecting the electrode fingers 150a to each other. The comb-shaped electrode 100b includes a plurality of electrode fingers 150b parallel or substantially parallel to each other and a busbar electrode 160b connecting the electrode fingers 150b to each other. The electrode fingers 150a and 150b extend in a direction perpendicular or substantially parallel to a propagation direction of acoustic waves (the X-axis direction).

An interdigital transducer (IDT) electrode 54 including the electrode fingers 150a and 150b and the busbar electrodes 160a and 160b has a layered structure including a fixing layer 541 and a main electrode layer 542 as illustrated in part (b) of FIG. 2A.

The fixing layer 541 improves the firmness of the substrate 5 and the main electrode layer 542 and, for example, Ti is preferably used as a material. The layer thickness of the fixing layer 541 is preferably, for example, about 12 nm.

As a material of the main electrode layer 542, for example, Al including about 1% Cu is preferably used. The layer thickness of the main electrode layer 542 is preferably, for example, about 162 nm.

A protective layer 55 covers the comb-shaped electrodes 100a and 100b. The protective layer 55 protects the main electrode layer 542 from external environment, controls the frequency temperature characteristic, increases moisture resistance, and the like. The protective layer 55 is preferably, for example, a dielectric film mainly including silicon dioxide. The thickness of the protective layer 55 is preferably, for example, about 25 nm.

Materials used for the fixing layer 541, the main electrode layer 542, and the protective layer 55 are not limited to the materials described above. Furthermore, the IDT electrode 54 does not necessarily have the layered structure described above. The IDT electrode 54 may be made of, for example, a metal, such as Ti, Al, Cu, Pt, Au, Ag, or Pd, or an alloy thereof, or may include a plurality of multilayer bodies made of the metal or the alloy. Additionally, the protective layer 55 is not necessarily provided.

Next, a layered structure of the substrate 5 is described.

As illustrated in part (c) of FIG. 2A, the substrate 5 includes a high-acoustic-velocity support substrate 51, a low-acoustic-velocity film 52, and a piezoelectric film 53, and has a structure in which the high-acoustic-velocity support substrate 51, the low-acoustic-velocity film 52, and the piezoelectric film 53 are layered in this order.

The piezoelectric film 53 is preferably made of, for example, a 50° Y-cut X-propagation LiTaO₃ piezoelectric single crystal or piezoelectric ceramic (a lithium tantalate single crystal or ceramic that is cut at a plane perpendicular to a normal line obtained by rotating an axis about an X-axis as a central axis by about 50° from a Y-axis and in which surface acoustic waves propagate in the X-axis direction). The thickness of the piezoelectric film 53 is preferably, for example, about 600 nm. The material and the cut-angle for a piezoelectric single crystal used for the piezoelectric film 53 are selected as appropriate in accordance with required specifications of individual filters.

The high-acoustic-velocity support substrate 51 supports the low-acoustic-velocity film 52, the piezoelectric film 53, and the IDT electrode 54. The high-acoustic-velocity support substrate 51 is also configured such that bulk waves in the high-acoustic-velocity support substrate 51 are faster in velocity than acoustic waves such as surface acoustic waves and boundary waves propagating along the piezoelectric film 53. The high-acoustic-velocity support substrate 51 confines surface acoustic waves in a portion provided by layering the piezoelectric film 53 and the low-acoustic-velocity film 52 so that the surface acoustic waves do not leak below the high-acoustic-velocity support substrate 51. The high-acoustic-velocity support substrate 51 is preferably, for example, a silicon substrate and the thickness of the high-acoustic-velocity support substrate 51 is preferably, for example, about 200 μm.

The low-acoustic-velocity film 52 is configured such that bulk waves in the low-acoustic-velocity film 52 are slower in velocity than bulk waves propagating in the piezoelectric film 53. The low-acoustic-velocity film 52 is disposed between the piezoelectric film 53 and the high-acoustic-velocity support substrate 51. This structure and a property of acoustic wave in which energy is naturally concentrated in low-acoustic-velocity media reduces or prevents leakage of surface acoustic wave energy outside the IDT electrode. The low-acoustic-velocity film 52 is preferably mainly made of, for example, silicon dioxide and the thickness of the low-acoustic-velocity film 52 is preferably, for example, about 670 nm.

By using the layered structure of the substrate 5 described above, the Q factor at a resonant frequency and an anti-resonant frequency can be greatly increased in comparison to known structures in which a piezoelectric substrate is a single layer. As a result, since an acoustic wave resonator with a relatively high Q factor can be configured, it is possible to configure a filter with low insertion loss by using the acoustic wave resonator.

In the case in which a thinned electrode is used in an acoustic wave resonator as described below for the purpose of improving the sharpness at low- and high-frequency ends of the pass band of the acoustic wave filter 10, it is assumed that the Q factor of the acoustic wave resonator is equally decreased depending on the thinning rate. However, the layered substrate structure described above can maintain the Q factor of the acoustic wave resonator 100 at high values. As a result, it is possible to provide the acoustic wave filter 10 in which the low-loss characteristic in the pass band is maintained.

The high-acoustic-velocity support substrate 51 may have a layered structure including a support substrate and a high-acoustic-velocity film configured such that bulk waves propagating in the high-acoustic-velocity film are faster in velocity than acoustic waves such as surface acoustic waves and boundary waves that propagate along the piezoelectric film 53. In this case, examples of a material used for the support substrate include piezoelectric materials, such as lithium tantalate, lithium niobate, and quartz-crystal; dielectric materials, such as various ceramics including alumina, magnesia, silicon nitride, aluminum nitride, silicon carbide, zirconia, cordierite, mullite, steatite, and forsterite, and sapphire and glass; semiconductors, such as silicon and gallium nitride; and resin substrates. The high-acoustic-velocity film can be made using various high-acoustic-velocity materials including aluminum nitride, aluminum oxide, silicon carbide, silicon nitride, silicon oxynitride, DLC films, or diamond; a medium mainly including the above-described materials; and a medium mainly including a mixture of the above-described materials.

Figure 2B:
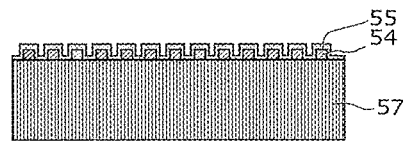
FIG. 2B is a sectional view schematically showing an acoustic wave resonator according to a modified example of a preferred embodiment of the present invention.

FIG. 2B is a sectional view schematically showing an acoustic wave resonator according to a first modified example of the present preferred embodiment. While the acoustic wave resonator 100 illustrated in FIG. 2A is described with an example in which the IDT electrode 54 is provided on the substrate 5 including the piezoelectric film 53, the substrate on which the IDT electrode 54 is provided can be a piezoelectric single-crystal substrate 57 including a single layer of a piezoelectric layer as illustrated in FIG. 2B. The piezoelectric single-crystal substrate 57 is preferably made of, for example, a LiNbO₃ piezoelectric single crystal. The acoustic wave resonator 100 according to the present modified example includes the LiNbO₃ piezoelectric single-crystal substrate 57, the IDT electrode 54, and the protective layer 55 provided on the IDT electrode 54 above the piezoelectric single-crystal substrate 57.

Concerning the piezoelectric film 53 and the piezoelectric single-crystal substrate 57 described above, the layered structure, the material, the cut-angle, and the thickness can be changed as appropriate in accordance with, for example, the required bandpass characteristic of the acoustic wave filter device. The acoustic wave resonator 100 including a LiTaO₃ piezoelectric substrate with a cut-angle other than the cut-angle described above can achieve the same or similar advantageous effects as those of the acoustic wave resonator 100 including the piezoelectric film 53 described above.

Here, an example (a practical example) of electrode parameters for the IDT electrode of the acoustic wave resonator 100 is described.

The wavelength of the acoustic wave resonator is defined as a wavelength λ that is the repetition cycle of the electrode fingers 150a or 150b of the IDT electrode 54 illustrated in part (b) of FIG. 2A. The electrode pitch is ½ of the wavelength λ and defined as (W+S), where the line width of the electrode fingers 150a and 150b of the comb-shaped electrodes 100a and 100b is W and the space width between an electrode finger 150a and an electrode finger 150b is S. An overlap width L of the comb-shaped electrodes 100a and 100b in a pair is, as illustrated in part (a) of FIG. 2A, the electrode finger length of the overlapping electrode fingers 150a and 150b as viewed in the propagation direction of acoustic waves (the X-axis direction). The electrode duty of each acoustic wave resonator is the line width occupancy rate of the electrode fingers 150a and 150b, that is, the rate of the line width to the sum of the line width and the space width of the electrode fingers 150a and 150b, which is defined as W/(W+S). The height of the comb-shaped electrodes 100a and 100b is h. Hereinafter, parameters regarding the shape of the IDT electrode of the acoustic wave resonator such as the wavelength λ, the overlap width L, the electrode duty, and the height h of the IDT electrode 54 are referred to as electrode parameters.

3. Operation Principle of Acoustic Wave Filter

Next, an operation principle of the ladder acoustic wave filter according to the present preferred embodiment is described.

Figure 3:
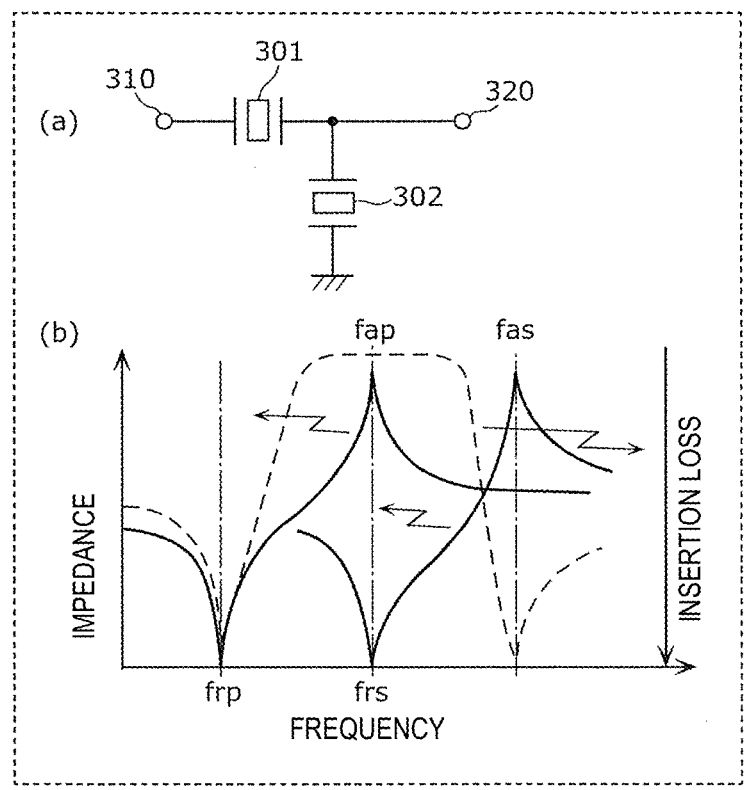
FIG. 3 includes a circuit diagram for explaining the operation principle of a ladder acoustic wave filter and a graph illustrating the frequency characteristic.

FIG. 3 includes a circuit diagram for explaining the operation principle of a ladder acoustic wave filter and a graph illustrating the frequency characteristic.

The acoustic wave filter illustrated in part (a) of FIG. 3 is a basic ladder filter including one series arm resonator 301 and one parallel arm resonator 302. As illustrated in part (b) of FIG. 3, the parallel arm resonator 302 has a resonant frequency frp and an anti-resonant frequency fap (>frp) in the resonance characteristic. The series arm resonator 301 has a resonant frequency frs and an anti-resonant frequency fas (>frs>frp) in the resonance characteristic.

When a band pass filter is defined by the ladder acoustic wave resonator, the anti-resonant frequency fap of the parallel arm resonator 302 and the resonant frequency frs of the series arm resonator 301 are set to be close to each other. In this configuration, the range close to the resonant frequency frp in which the impedance of the parallel arm resonator 302 approaches zero is a low-frequency-side stop band. Furthermore, as frequency increases in this configuration, the impedance of the parallel arm resonator 302 increases in the range close to the anti-resonant frequency fap while the impedance of the series arm resonator 301 approaches zero in the range close to the resonant frequency frs. As a result, the range close to the anti-resonant frequency fap to the resonant frequency frs is a band in which signals pass through the signal path from the input-output terminal 310 to the input-output terminal 320. As frequency further increases to the range close to the anti-resonant frequency fas, the impedance of the series arm resonator 301 increases, and as a result, the range is a high-frequency-side stop band.

The number of resonance levels defined by parallel arm resonators and series arm resonators is optimized as appropriate in accordance with required specifications. Usually, in the case in which the acoustic wave filter is defined by a plurality of resonance levels, a plurality of parallel arm resonators are configured to be identical or almost identical to each other with respect to the anti-resonant frequency fap and a plurality of series arm resonators are configured to be identical or almost identical to each other with respect to the anti-resonant frequency fas.

In the acoustic wave filter on the operation principle described above, when a high frequency signal is inputted from the input-output terminal 310, a potential difference occurs between the input-output terminal 310 and a reference terminal and the piezoelectric layer thus strains, so that a surface acoustic wave propagating in an X direction occurs. Here, by setting the wavelength λ of the IDT electrode 54 and the wavelength of the pass band to the same or almost the same wavelength, only high frequency signals of desired frequency components pass through the acoustic wave filter.

4. Electrode Structure of Acoustic Wave Filter

Next, a structure of the IDT electrode of the series arm resonator and the parallel arm resonator, which is a distinctive configuration of the acoustic wave filter 10 according to the present preferred embodiment, is described.

FIG. 4A is a schematic plan view showing an example of a structure of the IDT electrode of the series arm resonators 101 to 105 of the acoustic wave filter 10 according to the present preferred embodiment. FIG. 4B is a schematic plan view showing an example of a structure of the IDT electrode of the parallel arm resonators 201 to 204 of the acoustic wave filter 10 according to the present preferred embodiment.

FIG. 4A shows as an example a schematic plan-view diagram illustrating the structure of the IDT electrode of the series arm resonator 101 as a representative of the series arm resonators 101 to 105. The series arm resonator 101 shown in FIG. 4A is used only to explain a typical structure of the series arm resonators 101 to 105, and thus, the number of electrode fingers of an electrode, the length of electrode fingers, and the like are not limited to this instance.

The series arm resonator 101 includes the substrate 5 with piezoelectricity, comb-shaped electrodes 101a and 101b provided on the substrate 5, and reflectors 141.

As illustrated in FIG. 4A, the comb-shaped electrode 101a includes a plurality of electrode fingers 151a parallel to each other and a busbar electrode 161a connecting one-side ends of the electrode fingers 151a to each other. The comb-shaped electrode 101b includes a plurality of electrode fingers 151b parallel to each other and a busbar electrode 161b connecting one-side ends of the electrode fingers 151b to each other. The plurality of electrode fingers 151a and 151b extend in a direction perpendicular or substantially perpendicular to a propagation direction of acoustic waves (the X-axis direction). The comb-shaped electrodes 101a and 101b face each other in a state in which the plurality of electrode fingers 151a and 151b are interposed between their gaps. This means that the IDT electrode of the series arm resonator 101 includes the comb-shaped electrodes 101a and 101b in a pair.

The comb-shaped electrode 101a includes dummy electrodes extending in a longitudinal direction of the plurality of electrode fingers 151b to face the plurality of electrode fingers 151b, but the dummy electrodes are not necessarily provided. Moreover, the comb-shaped electrode 101b includes dummy electrodes extending in a longitudinal direction of the plurality of electrode fingers 151a to face the plurality of electrode fingers 151a, but the dummy electrodes are not necessarily provided.

The reflectors 141 include a plurality of electrode fingers parallel or substantially parallel to each other and busbar electrodes connecting the plurality of electrode fingers to each other. The reflectors 141 are positioned on both sides of the pair of the comb-shaped electrodes 101a and 101b.

The IDT electrode defined by the comb-shaped electrodes 101a and 101b in a pair has, as illustrated in part (b) of FIG. 2A, a layered structure including the fixing layer 541 and the main electrode layer 542, but the structure of the IDT electrode is not limited to the layered structure.

Here, electrode fingers 152 are provided in the IDT electrode of the series arm resonator 101 in a dispersed manner. The electrode fingers 152 are each a first thinned electrode (floating electrode) that is not coupled to any of the busbar electrodes 161a and 161b and that is positioned in parallel or substantially in parallel with the plurality of electrode fingers 151a and 151b at the same pitch as that of the plurality of electrode fingers 151a and 151b. The plurality of electrode fingers 151a and 151b are positioned between two adjacent electrode fingers 152. This means that the pitch of the electrode fingers 152 is greater than the pitch of the plurality of electrode fingers 151a and 151b.

FIG. 4B shows as an example a schematic plan-view diagram illustrating the structure of the IDT electrode of the parallel arm resonator 201 as a representative of the parallel arm resonators 201 to 204. The parallel arm resonator 201 shown in FIG. 4B is used only to explain a typical structure of the parallel arm resonators 201 to 204, and thus, the number of electrode fingers constituting an electrode, the length of electrode fingers, and the like are not limited to this instance.

The parallel arm resonator 201 includes the substrate 5 with piezoelectricity, comb-shaped electrodes 201a and 201b provided on the substrate 5, and reflectors 241.

As illustrated in FIG. 4B, the comb-shaped electrode 201a include a plurality of electrode fingers 251a parallel or substantially parallel to each other and a busbar electrode 261a connecting one-side ends of the electrode fingers 251a to each other. The comb-shaped electrode 201b includes a plurality of electrode fingers 251b parallel or substantially parallel to each other and a busbar electrode 261b connecting one-side ends of the electrode fingers 251b to each other. The plurality of electrode fingers 251a and 251b extend in a direction perpendicular or substantially perpendicular to a propagation direction of acoustic waves (the X-axis direction). The comb-shaped electrodes 201a and 201b face each other in a state in which the plurality of electrode fingers 251a and 251b are interposed between their gaps. This means that the IDT electrode of the parallel arm resonator 201 includes the comb-shaped electrodes 201a and 201b in a pair.

The comb-shaped electrode 201a includes dummy electrodes extending in a longitudinal direction of the plurality of electrode fingers 251b to face the plurality of electrode fingers 251b, but the dummy electrodes are not necessarily provided. Moreover, the comb-shaped electrode 201b includes dummy electrodes extending in a longitudinal direction of the plurality of electrode fingers 251a to face the plurality of electrode fingers 251a, but the dummy electrodes are not necessarily provided.

The reflectors 241 include a plurality of electrode fingers parallel or substantially parallel to each other and busbar electrodes connecting the plurality of electrode fingers to each other. The reflectors 241 are positioned on both sides of the pair of the comb-shaped electrodes 201a and 201b.

The IDT electrode including the comb-shaped electrodes 201a and 201b in a pair has, as illustrated in part (b) of FIG. 2A, a layered structure of the fixing layer 541 and the main electrode layer 542, but the structure of the IDT electrode is not limited to the layered structure.

Here, electrode fingers 252 are provided in the IDT electrode of the parallel arm resonator 201 in a dispersed manner. The electrode fingers 252 are each a second thinned electrode (filled electrode) that has a widest electrode finger width in the IDT electrode of the parallel arm resonator 201 and the electrode finger width is twice or more the average electrode finger width of the electrode fingers excluding the electrode fingers 252. In other words, the electrode fingers 252 are each a second thinned electrode (filled electrode) that is provided as one electrode finger by combining adjacent electrode fingers 251a and 251b with spaces between the adjacent electrode fingers 251a and 251b, that is connected to either the busbar electrode 261a or 261b, and that has an electrode finger width greater than the electrode finger width of the plurality of electrode fingers 251a and 251b. The plurality of electrode fingers 251a and 251b are positioned between two adjacent electrode fingers 252. This means that the pitch of the electrode fingers 252 is greater than the pitch of the plurality of electrode fingers 251a and 251b.

Here, the thinning rate of the IDT electrode is defined. When the number of the electrode fingers 152 in the IDT electrode is M and the number of pairs in the IDT electrode is N in the case in which the IDT electrode is provided by repeatedly disposing the electrode fingers 151a and 151b without providing the electrode fingers 152 in which one electrode finger 151a and one electrode finger 151b adjacent to each other are deemed as a pair, a thinning rate (a first thinning rate) of the IDT electrode of the series arm resonators 101 to 105 is provided by Expression 1 indicated below. Similarly, when the number of the electrode fingers 252 in the IDT electrode is M and the number of pairs in the IDT electrode is N in the case in which the IDT electrode is provided by repeatedly disposing the electrode fingers 251a and 251b without providing the electrode fingers 252 in which one electrode finger 251a and one electrode finger 251b adjacent to each other are deemed as a pair, a thinning rate (a second thinning rate) of the IDT electrode of the parallel arm resonators 201 to 204 is provided by Expression 1 indicated below.

Thinning rate (first thinning rate or second thinning rate)=$M/\{2(N-M)+1\}$  (Expression 1)

Table 1 indicates an example of the electrode parameters of the acoustic wave filter 10 according to the present preferred embodiment.

TABLE 1

| Acoustic wave filter 10 (Preferred Embodiment) | Series arm resonator 101 | Series arm resonator 102 | Series arm resonator 103 | Series arm resonator 104 | Series arm resonator 105 |
|---|---|---|---|---|---|
| Wavelength λ (μm) | 1.565 | 1.547 | 1.511 | 1.578 | 1.572 |
| Overlap width (μm) | 26.1 | 21.9 | 24.9 | 22.4 | 40.2 |
| Pair count (pair) | 148 | 136 | 112 | 157 | 159 |
| Thinning rate (%) | 9 | 9 | 9 | 9 | 9 |

| | Parallel arm resonator 201 | Parallel arm resonator 202 | Parallel arm resonator 203 | Parallel arm resonator 204 |
|---|---|---|---|---|
| Wavelength λ (μm) | 1.613 | 1.594 | 1.594 | 1.613 |
| Overlap width (μm) | 53.0 | 15.0 | 15.0 | 24.1 |

TABLE 1-continued

| | | | | |
|---|---|---|---|---|
| Pair count (pair) | 85 | 154 | 100 | 170 |
| Thinning rate (%) | 9 | 9 | 9 | 9 |

As indicated in Table 1, in the present preferred embodiment, the first thinned electrode is used in the IDT electrode of all the series arm resonators 101 to 105 and the second thinned electrode is used in the IDT electrode of all the parallel arm resonators 201 to 204. This configuration improves to the greatest extent the sharpness at both low- and high-frequency ends of the pass band.

The first thinned electrode may be used in at least one IDT electrode of the series arm resonators 101 to 105. Also in this case, it is possible to improve the sharpness at the high-frequency end of pass band. Similarly, the second thinned electrode may be used in at least one IDT electrode of the parallel arm resonators 201 to 204. Also in this case, it is possible to improve the sharpness at the low-frequency end of pass band.

5. Resonance Characteristic of Acoustic Wave Resonator

Figure 5A:
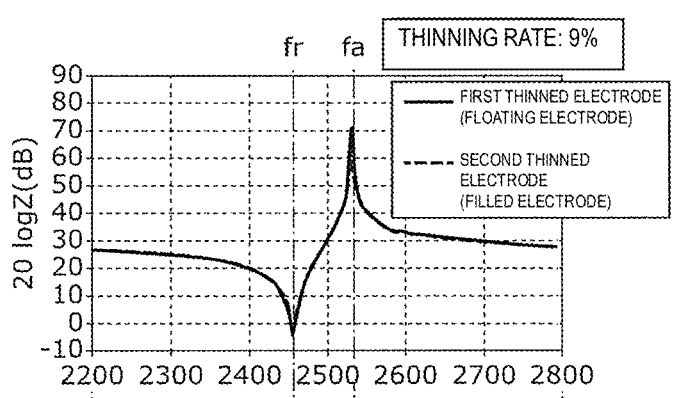
FIGS. 5A and 5B are graphs illustrating the impedance characteristic and the Q characteristic in which an acoustic wave resonator including a first thinned electrode and an acoustic wave resonator including a second thinned electrode are compared to each other.
Figure 5B:
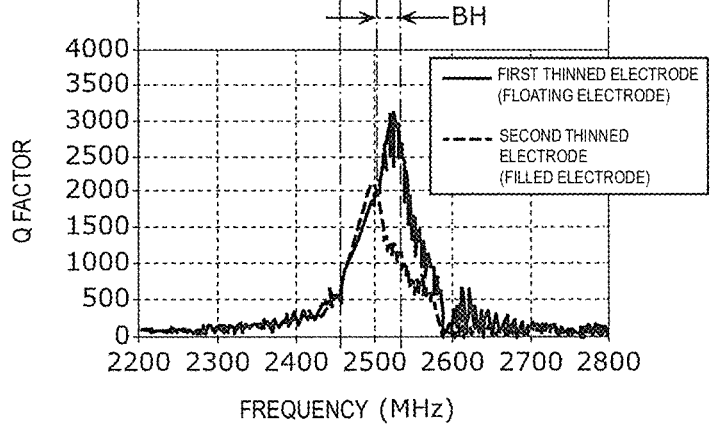

FIGS. 5A and 5B are graphs illustrating the impedance characteristic (FIG. 5A) and the Q characteristic (FIG. 5B) in which an acoustic wave resonator including the first thinned electrode (floating electrode) and an acoustic wave resonator including the second thinned electrode (filled electrode) are compared to each other. The first thinning rate and the second thinning rate of the acoustic wave resonators indicated in FIGS. 5A and 5B are both about 9%, for example.

As illustrated in FIG. 5A, the impedance representing the resonance characteristic of the acoustic wave resonator is a minimum value close to zero at a resonant frequency fr and a maximum value close to infinity at an anti-resonant frequency fa. Regarding the impedance characteristic, the acoustic wave resonator including the first thinned electrode (floating electrode) and the acoustic wave resonator including the second thinned electrode (filled electrode) are identical or almost identical to each other. In the case in which the acoustic wave resonator having the impedance characteristic described above is used as any of the series arm resonator and the parallel arm resonators of the acoustic wave filter, the frequency and the attenuation at the attenuation pole in the filter bandpass characteristic is the same or almost the same.

By contrast, as illustrated in FIG. 5B, in a frequency range BL on the low-frequency side of a frequency range of the resonant frequency fr to the anti-resonant frequency fa, the second thinned electrode (filled electrode) is higher than the first thinned electrode (floating electrode) with respect to the Q factor. Furthermore, in a frequency range BH on the high-frequency side of the frequency range of the resonant frequency fr to the anti-resonant frequency fa, the first thinned electrode (floating electrode) is higher than the second thinned electrode (filled electrode) with respect to the Q factor.

To improve the sharpness at low- and high-frequency ends of the pass band of the acoustic wave filter including series arm resonators and parallel arm resonators, it is known that subjecting the IDT electrode to weighting using a thinning technique is effective. Particularly to the ladder acoustic wave filter, the sharpness at the low-frequency end of pass band is improved when the Q factor in the range close to the resonant frequency of the parallel arm resonator is improved, while the sharpness at the high-frequency end of pass band is improved when the Q characteristic in the range close to the anti-resonant frequency of series arm resonator is improved.

The inventor of preferred embodiments of the present invention discovered that, as illustrated in FIGS. 5A and 5B, when the acoustic wave resonator including the first thinned electrode (floating electrode) and the acoustic wave resonator including the second thinned electrode (filled electrode) are compared to each other with respect to the Q factor, the acoustic wave resonator including the second thinned electrode (filled electrode) provides higher Q factors in the low-frequency-side area (the frequency range BL) close to the resonant frequency, while the acoustic wave resonator including the first thinned electrode (floating electrode) provides higher Q factors in the high-frequency-side area (the frequency range BH) close to the anti-resonant frequency.

The frequency characteristic of the Q factor affected by the shape of the thinned electrode depends on the following cause. In the second thinned electrode (filled electrode), the filled region is occupied by an electrode film, and as a result, the acoustic velocity is relatively low in comparison to a normal unfilled region. By contrast, in the first thinned electrode (floating electrode), the acoustic velocity is relatively high in comparison to the filled region and the normal region. For this reason, the Q factor of the second thinned electrode (filled electrode) is improved on the low-frequency side corresponding to low acoustic velocity, while the Q factor of the first thinned electrode (floating electrode) is improved on the high-frequency side corresponding to high acoustic velocity.

In this view, in the acoustic wave filter 10 according to the present preferred embodiment, the IDT electrode including the second thinned electrode (filled electrode) is used in the parallel arm resonators 201 to 204 and the IDT electrode including the first thinned electrode (floating electrode) is used in the series arm resonators 101 to 105. With this configuration, it is possible to provide the acoustic wave filter 10 with high sharpness at both low- and high-frequency ends of pass band.

Figure 6A:
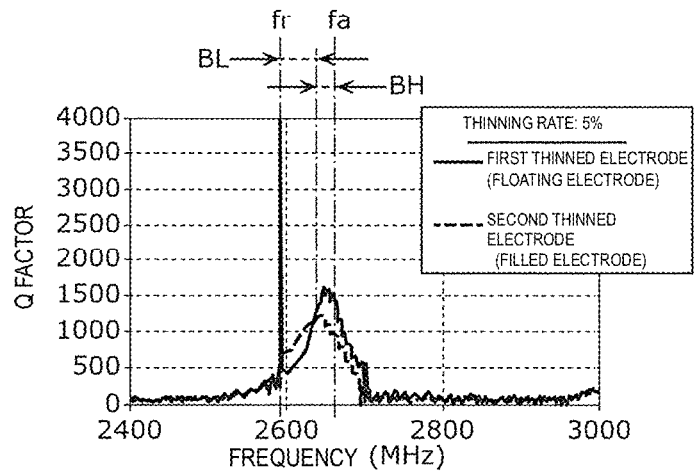
FIG. 6A is a graph in which the Q characteristic of the acoustic wave resonator including the first thinned electrode and the Q characteristic of the acoustic wave resonator including the second thinned electrode are compared to each other in the case of approximately a 5% thinning rate.
Figure 6B:
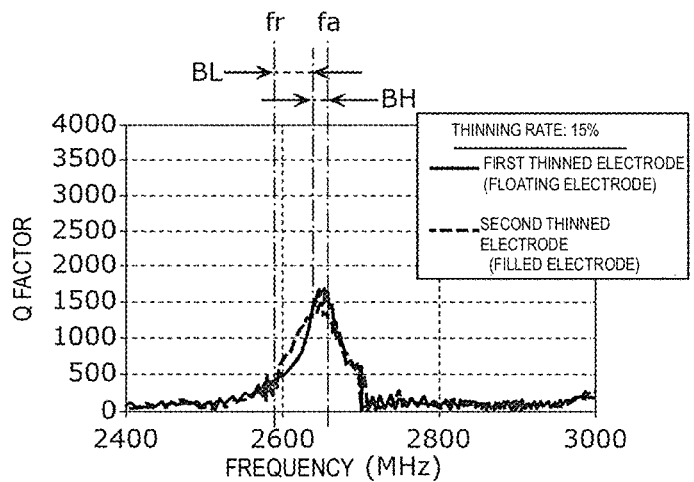
FIG. 6B is a graph in which the Q characteristic of the acoustic wave resonator including the first thinned electrode and the Q characteristic of the acoustic wave resonator including the second thinned electrode are compared to each other in the case of approximately a 15% thinning rate.
Figure 6C:
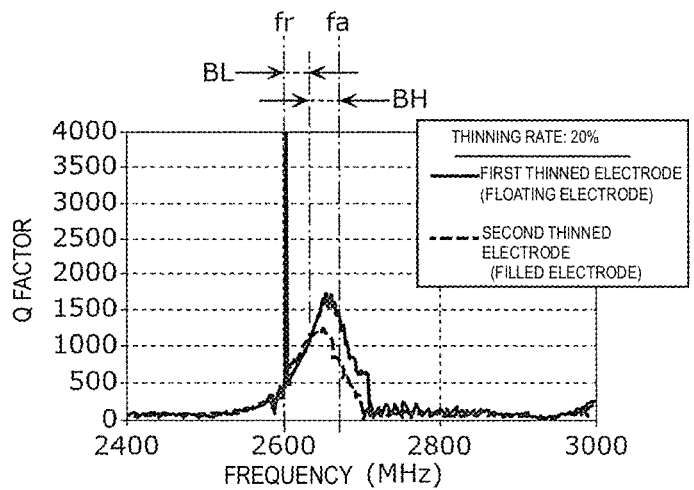
FIG. 6C is a graph in which the Q characteristic of the acoustic wave resonator including the first thinned electrode and the Q characteristic of the acoustic wave resonator including the second thinned electrode are compared to each other in the case of approximately a 20% thinning rate.

FIG. 6A is a graph in which the Q characteristic of the acoustic wave resonator including the first thinned electrode and the Q characteristic of the acoustic wave resonator including the second thinned electrode are compared to each other in the case of approximately a 5% thinning rate (both the first thinning rate and the second thinning rate). FIG. 6B is a graph in which the Q characteristic of the acoustic wave resonator including the first thinned electrode and the Q characteristic of the acoustic wave resonator including the second thinned electrode are compared to each other in the case of approximately a 15% thinning rate (both the first thinning rate and the second thinning rate). FIG. 6C is a graph in which the Q characteristic of the acoustic wave resonator including the first thinned electrode and the Q characteristic of the acoustic wave resonator including the second thinned electrode are compared to each other in the case of approximately a 20% thinning rate (both the first thinning rate and the second thinning rate). The acoustic wave resonators in FIGS. 6A to 6C differs from the acoustic wave resonators in FIG. 5B in numerical values of the electrode parameters other than the thinning rate.

As illustrated in FIGS. 6A to 6C, while the thinning rate varies, concerning the frequency range of the resonant frequency fr to the anti-resonant frequency fa, the Q factor of the second thinned electrode (filled electrode) is higher than the Q factor of the first thinned electrode (floating electrode) in the frequency range BL on the low-frequency side and the Q factor of the first thinned electrode (floating electrode) is higher than the Q factor of the second thinned electrode (filled electrode) in the frequency range BH on the high-frequency side.

The Q factor improves when the IDT electrode includes a thinned electrode, but the Q factor of the IDT electrode deteriorates when the thinning rate is set at over about 30%. As a result, in comparison to the IDT electrode that is configured to support the same band width and that does not include a thinned electrode, the sharpness may be not improved at high- and low-frequency ends of pass band. Thus, it is preferable that the first thinning rate of the IDT electrode including the first thinned electrode (floating electrode) is about 30% or less, for example.

With this configuration, relatively high Q factors can be achieved in the range close to the anti-resonant frequency fas of the series arm resonators 101 to 105 including the first thinned electrode. As a result, in comparison to the acoustic wave filter that supports the same band width and in which the series arm resonators are formed without using the first thinned electrode, the sharpness at the high-frequency end of pass band can be improved.

Furthermore, it is preferable that the second thinning rate of the IDT electrode including the second thinned electrode (filled electrode) is about 30% or less, for example.

With this configuration, relatively high Q factors can be achieved in the range close to the resonant frequency frp of the parallel arm resonators 201 to 204 including the second thinned electrode. As a result, in comparison to the acoustic wave filter that supports the same band width and in which the parallel arm resonators are formed without using the second thinned electrode, the sharpness at the low-frequency end of pass band can be improved.

6. Bandpass Characteristic of Acoustic Wave Filter

Figure 7:
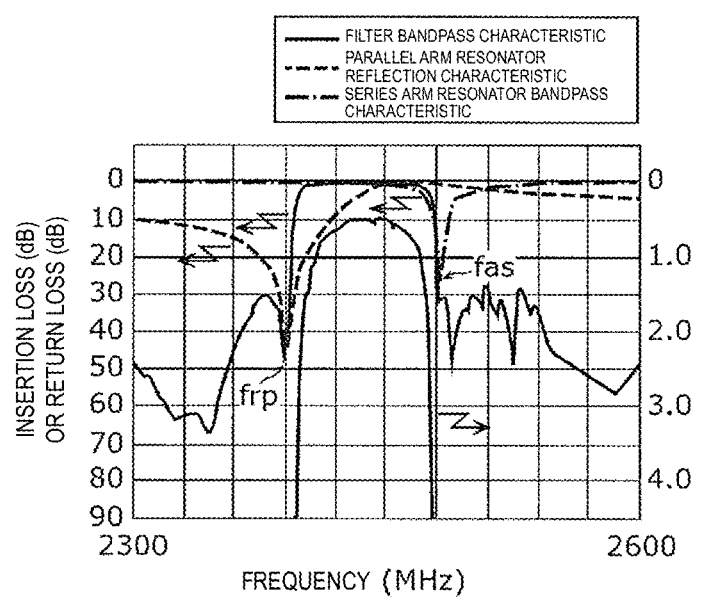
FIG. 7 is a graph illustrating the bandpass characteristic of an acoustic wave filter according to a preferred embodiment of the present invention, the bandpass characteristic of the series arm resonators, and the reflection characteristic of the parallel arm resonators.

FIG. 7 is a graph illustrating the bandpass characteristic of the acoustic wave filter 10 according to the present preferred embodiment, the bandpass characteristic of the series arm resonators 101 to 105, and the reflection characteristic of the parallel arm resonators 201 to 204. In FIG. 7, in addition to the bandpass characteristic (insertion loss) in a surrounding range including the pass band of the acoustic wave filter 10, the bandpass characteristic (insertion loss) of one of the series arm resonators 101 to 105 and the reflection characteristic (return loss) of one of the parallel arm resonators 201 to 204 are illustrated. In the reflection characteristic of the parallel arm resonator, the frequency with a maximum value of return loss is the resonant frequency frp of the parallel arm resonator. In the bandpass characteristic of the series arm resonator, the frequency with a maximum value of insertion loss is the anti-resonant frequency fas of the series arm resonator.

In the acoustic wave filter 10 according to the present preferred embodiment, the IDT electrode including the second thinned electrode (filled electrode) is used in the parallel arm resonators 201 to 204 and the IDT electrode including the first thinned electrode (floating electrode) is used in the series arm resonators 101 to 105, and thus, as illustrated in FIG. 7, the excellent sharpness is achieved at both the low- and high-frequency ends of pass band.

Figure 8:
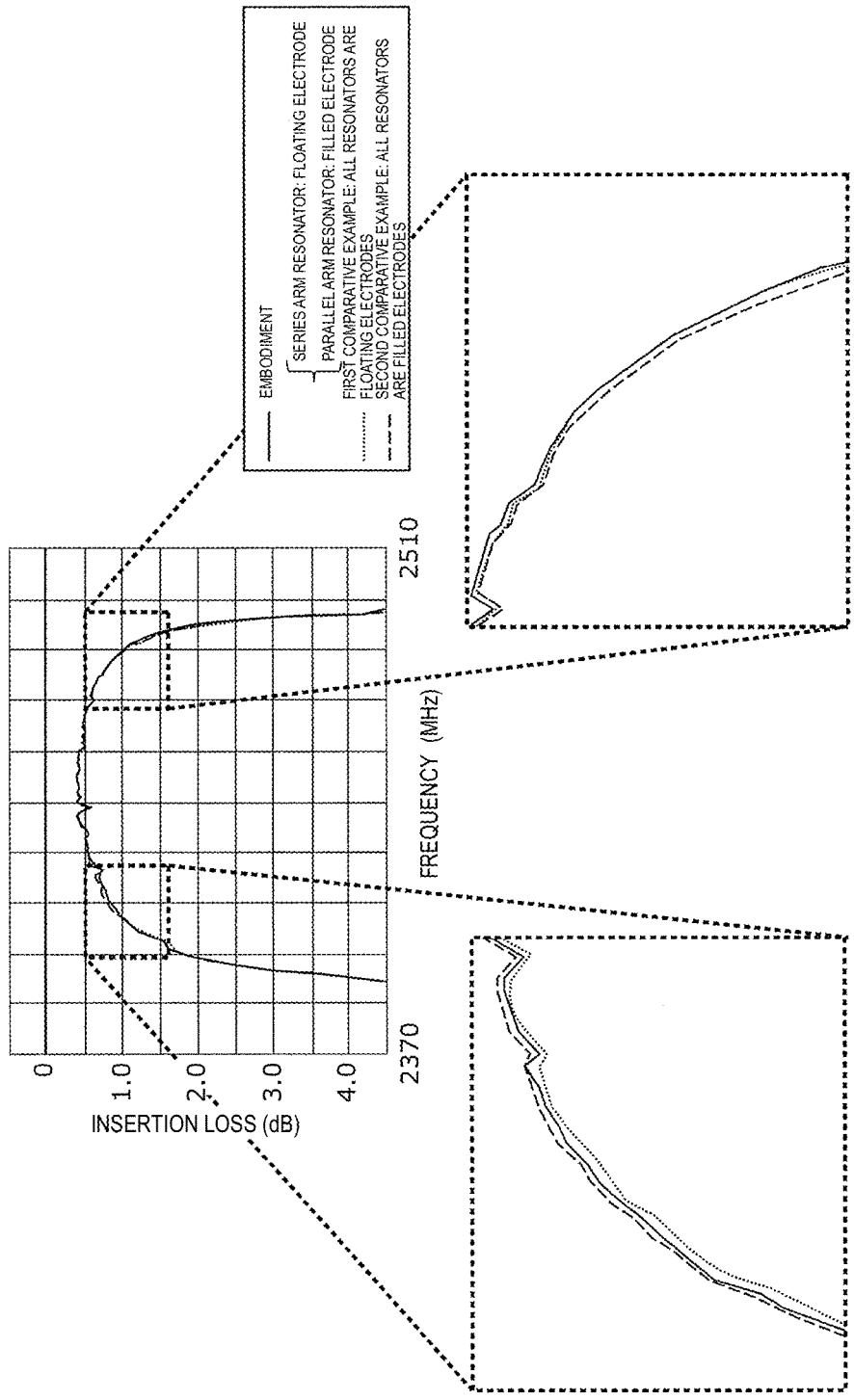
FIG. 8 is a graph in which an acoustic wave filter according to a preferred embodiment of the present invention, an acoustic wave filter according to a first comparative example, and an acoustic wave filter according to a second comparative example are compared to each other with respect to insertion loss in a surrounding range including a pass band.

FIG. 8 is a graph in which the acoustic wave filter according to the present preferred embodiment, an acoustic wave filter according to a first comparative example, and an acoustic wave filter according to a second comparative example are compared to each other with respect to insertion loss in a surrounding range including the pass band. In FIG. 8, the thinning rate of the IDT electrode included in the acoustic wave filter is about 9% among all the preferred embodiment, the first comparative example, and the second comparative example.

The acoustic wave filter according to the first comparative example differs from the acoustic wave filter 10 according to the present preferred embodiment in the configuration in which the first thinned electrode (floating electrode) is used in all the series arm resonators 101 to 105 and the parallel arm resonators 201 to 204 and the second thinned electrode (filled electrode) is not used in the parallel arm resonators 201 to 204.

The acoustic wave filter according to the second comparative example differs from the acoustic wave filter 10 according to the present preferred embodiment in the configuration in which the second thinned electrode (filled electrode) is used in all the series arm resonators 101 to 105 and the parallel arm resonators 201 to 204 and the first thinned electrode (floating electrode) is not used in the series arm resonators 101 to 105.

As illustrated in FIG. 8, in a central area of the pass band, there is no or substantially no difference in insertion loss of the acoustic wave filter among the present preferred embodiment, the first comparative example, and the second comparative example. Furthermore, in a low-frequency-side area further than the low-frequency end of pass band (an area in which the sharpness of insertion loss is at a maximum level in the low-frequency side) and in a high-frequency-side area further than the high-frequency end of pass band (an area in which the sharpness of insertion loss is at a maximum level in the high-frequency side), there is no or substantially no difference with regard to insertion loss of the acoustic wave filter among the present preferred embodiment, the first comparative example, and the second comparative example. By contrast, at the low- and high-frequency ends of the pass band, there are differences in insertion loss of the acoustic wave filter among the present preferred embodiment, the first comparative example, and the second comparative example.

At the low-frequency end of pass band, insertion loss increases in the following order: the second comparative example, the present preferred embodiment, the first comparative example. In the acoustic wave filter according to the first comparative example, the first thinned electrode (floating electrode), which provides relatively high Q factors in the frequency range BH on the high-frequency side, is used in the parallel arm resonators 201 to 204, and as a result, insertion loss is increased in the frequency range BL on the low-frequency side. Conversely, concerning the acoustic wave filters according to the present preferred embodiment and the second comparative example in which the second thinned electrode (filled electrode), which provides relatively high Q factors in the frequency range BL on the low-frequency side, is used in the parallel arm resonators 201 to 204, insertion loss is decreased in the frequency range BL on the low-frequency side. For this reason, the sharpness of insertion loss at the low-frequency end of pass band is improved with regard to the acoustic wave filters according to the present preferred embodiment and the second comparative example in comparison to the acoustic wave filter according to the first comparative example.

At the high-frequency end of pass band, insertion loss increases in the following order: the present preferred embodiment, the first comparative example, the second comparative example. In the acoustic wave filter according to the second comparative example, the second thinned electrode (filled electrode), which provides relatively high Q factors in the frequency range BL on the low-frequency side, is used in the series arm resonators 101 to 105, and as a result, insertion loss is increased in the frequency range BH on the high-frequency side. Conversely, concerning the acoustic wave filters according to the present preferred embodiment and the first comparative example in which the first thinned electrode (floating electrode), which provides relatively high Q factors in the frequency range BH on the high-frequency side, is used in the series arm resonators 101 to 105, insertion loss is decreased in the frequency range BH on the high-frequency side. For this reason, the sharpness of insertion loss at the high-frequency end of pass band is improved with regard to the acoustic wave filters according to the present preferred embodiment and the first comparative example in comparison to the acoustic wave filter according to the second comparative example.

Therefore, it is understood that the sharpness of insertion loss at both low- and high-frequency ends of pass band can be improved with the acoustic wave filter 10 according to the present preferred embodiment.

Figure 9:
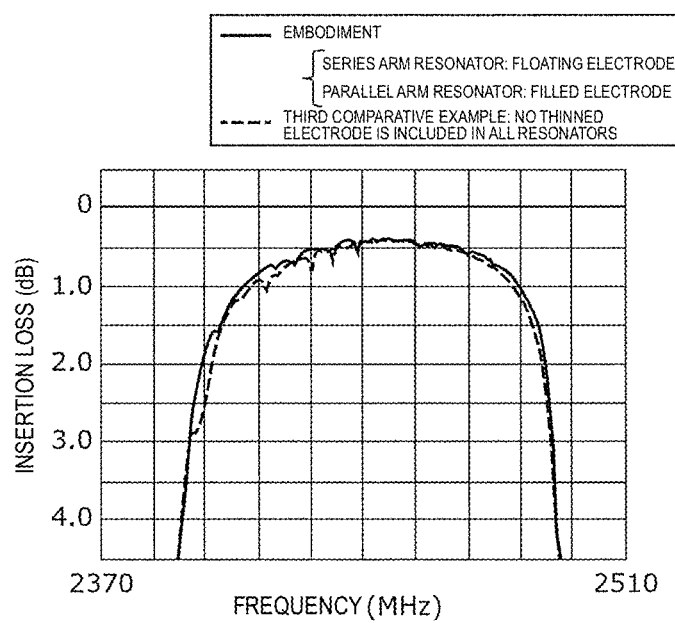
FIG. 9 is a graph in which an acoustic wave filter according to a preferred embodiment of the present invention and an acoustic wave filter according to a third comparative example are compared to each other with respect to insertion loss in a surrounding range including the pass band.

FIG. 9 is a graph in which the acoustic wave filter according to the present preferred embodiment and an acoustic wave filter according to a third comparative example are compared to each other with respect to insertion loss in a surrounding range including the pass band.

The acoustic wave filter according to the third comparative example differs from the acoustic wave filter 10 according to the present preferred embodiment in the configuration in which no thinned electrode is used in any of the series arm resonators 101 to 105 and the parallel arm resonators 201 to 204. The electrode parameters of the IDT electrode in the acoustic wave filter according to the third comparative example are adjusted so that the pass band width of the acoustic wave filter according to the third comparative example and the pass band width of the acoustic wave filter 10 according to the present preferred embodiment are identical or substantially identical to each other.

As illustrated in FIG. 9, at the low- and high-frequency ends of the pass band, insertion loss is decreased with respect to the acoustic wave filter 10 according to the present preferred embodiment in comparison to the acoustic wave filter according to the third comparative example. Furthermore, in an low-frequency-side area further than the low-frequency end of pass band (an area in which the sharpness of insertion loss is at a maximum level in the low-frequency side) and in a high-frequency-side area further than the high-frequency end of pass band (an area in which the sharpness of insertion loss is at a maximum level in the high-frequency side), there is no or substantially no difference with regard to insertion loss of the acoustic wave filter between the present preferred embodiment and the third comparative example.

Thus, in comparison to the acoustic wave filter of the 0% thinning rate in which the first thinned electrode (floating electrode) is not used in the series arm resonators 101 to 105 and the second thinned electrode (filled electrode) is not used in the parallel arm resonators 201 to 204, the sharpness of insertion loss can be improved at both low- and high-frequency ends of pass band with the acoustic wave filter 10 according to the present preferred embodiment while the pass band width of the acoustic wave filters according to the present preferred embodiment and the third comparative example is maintained.

While the acoustic wave filters 10 according to the present preferred embodiments of the present invention have been described above, the acoustic wave filters of the present invention are not limited to the preferred embodiments described above. The present invention also includes other preferred embodiments including any combination of the elements of the above-described preferred embodiments, other modified examples obtained by making various modifications to the above-described preferred embodiments that occur to those skilled in the art without departing from the scope of the present invention, and various hardware devices including the acoustic wave filter 10 of the above-described preferred embodiments of the present invention.

Preferred embodiments of the present invention can be used, as an acoustic wave filter with excellent sharpness that can support multiband and multimode frequency standards, widely for communication devices, such as a mobile phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
a first input-output terminal and a second input-output terminal;
one or more series arm resonators on a path connecting the first input-output terminal and the second input-output terminal; and
one or more parallel arm resonators between the path and ground; wherein
the one or more series arm resonators and the one or more parallel arm resonators are each an acoustic wave resonator including an interdigital transducer electrode provided on a substrate with piezoelectricity;
the interdigital transducer electrode includes a pair of comb-shaped electrodes each including a plurality of electrode fingers that extend in a direction crossing a propagation direction of acoustic waves and that are in parallel or substantially in parallel with each other and a busbar electrode that connects one-side ends of electrode fingers of the plurality of electrode fingers to each other; and
when a first electrode finger of the plurality of electrode fingers that is not coupled to either busbar electrode of the pair of comb-shaped electrodes is determined as a first thinned electrode; and when a second electrode finger out the plurality of electrode fingers that has a widest electrode finger width twice or more an average electrode finger width of the electrode fingers excluding the first electrode finger is determined as a second thinned electrode; the interdigital transducer electrode of at least one of the one or more series arm resonators includes the first thinned electrode; and the interdigital transducer electrode of at least one of the one or more parallel arm resonators includes the second thinned electrode.

2. The acoustic wave filter according to claim 1, wherein the interdigital transducer electrode of each of the one or more series arm resonators includes the first thinned electrode.

3. The acoustic wave filter according to claim 1, wherein the interdigital transducer electrode of each of the one or more parallel arm resonators includes the second thinned electrode.

4. The acoustic wave filter according to claim 1, wherein in the interdigital transducer electrode of each of the one or more series arm resonators, when a proportion of a count of the first thinned electrode to a total count of the plurality of electrode fingers is determined as a first thinning rate of the interdigital transducer electrode, the first thinning rate of the interdigital transducer electrode including the first thinned electrode is about 30% or less.

5. The acoustic wave filter according to claim 1, wherein in the interdigital transducer electrode of each of the one or more parallel arm resonators, when a proportion of a count of the second thinned electrode to a total count of the plurality of electrode fingers is determined as a second thinning rate of the interdigital transducer electrode, the second thinning rate of the interdigital transducer electrode including the second thinned electrode is about 30% or less.

6. The acoustic wave filter according to claim 1, wherein the substrate includes a piezoelectric film including one surface on which the interdigital transducer electrode is provided, a high-acoustic-velocity support substrate in which a bulk wave propagates at an acoustic velocity higher than an acoustic velocity of an acoustic wave propagating along the piezoelectric film, and a low-acoustic-velocity film that is positioned between the high-acoustic-velocity support substrate and the piezoelectric film and in which a bulk wave propagates at an acoustic velocity lower than an acoustic velocity of a bulk wave propagating in the piezoelectric film.

7. The acoustic wave filter according to claim 1, wherein the one or more series arm resonators include five series arm resonators.

8. The acoustic wave filter according to claim 1, wherein the one or more parallel arm resonators include four parallel arm resonators.

9. The acoustic wave filter according to claim 1, wherein the interdigital transducer includes a fixing layer and a main electrode layer.

10. The acoustic wave filter according to claim 9, wherein the fixing layer is made of Ti.

11. The acoustic wave filter according to claim 9, wherein the fixing layer has a thickness of about 12 nm.

12. The acoustic wave filter according to claim 9, wherein the main electrode layer is made Al including about 1% Cu.

13. The acoustic wave filter according to claim 9, wherein the main electrode layer has a thickness of about 162 nm.

14. The acoustic wave filter according to claim 1, wherein the interdigital transducer electrode is covered with a protective layer.

15. The acoustic wave filter according to claim 14, wherein the protective layer is defined by a dielectric film mainly including silicon dioxide.

16. The acoustic wave filter according to claim 14, wherein the protective layer has a thickness of about 25 nm.

17. The acoustic wave filter according to claim 1, wherein substrate is defined by a piezoelectric film made of a 50° Y-cut X-propagation $LiTaO_3$ piezoelectric single crystal or piezoelectric ceramic.

18. The acoustic wave filter according to claim 17, wherein the piezoelectric film has a thickness of about 600 nm.

* * * * *